United States Patent [19]
Flaker et al.

[11] Patent Number: 4,719,418

[45] Date of Patent: Jan. 12, 1988

[54] DEFECT LEAKAGE SCREEN SYSTEM

[75] Inventors: Roy C. Flaker; Russell J. Houghton, both of Essex Junction, Vt.

[73] Assignee: International Business Machines Corporation, Armonk, N.Y.

[21] Appl. No.: 703,001

[22] Filed: Feb. 19, 1985

[51] Int. Cl.⁴ ............................................. G01R 31/30
[52] U.S. Cl. .......................... 324/158 R; 324/258 T; 324/73 R
[58] Field of Search .......... 324/158 R, 158 D, 158 T, 324/73 R; 365/155, 201, 226, 227, 228, 229; 371/16, 18, 24, 28, 21

[56] References Cited

U.S. PATENT DOCUMENTS

| | | | |
|---|---|---|---|
| 3,795,859 | 3/1974 | Benante et al. | 324/73 R |
| 3,900,838 | 8/1975 | Wiedmann | 365/227 |
| 3,995,215 | 11/1976 | Chu et al. | 324/158 R |
| 4,004,222 | 1/1977 | Gebhard | 324/158 |
| 4,015,203 | 3/1977 | Verkuil | 324/158 |
| 4,410,816 | 10/1983 | Kanai | 324/73 R |
| 4,418,403 | 11/1983 | O'Toole et al. | 371/21 |
| 4,459,686 | 7/1984 | Toyoda | 365/201 |
| 4,553,225 | 11/1985 | Ohe | 371/21 |

FOREIGN PATENT DOCUMENTS

| | | | |
|---|---|---|---|
| 0004070 | 1/1981 | Japan | 324/158 T |
| 0020991 | 2/1982 | Japan | 365/201 |

OTHER PUBLICATIONS

"Variable Standby Current Source Scheme, by Chan et al, *IBM Tech. Disc. Bull.*, vol. 27, #1A, 6/84, pp. 240-244.

Primary Examiner—Reinhard J. Eisenzopf
Assistant Examiner—W. Burns
Attorney, Agent, or Firm—Stephen J. Limanek

[57] ABSTRACT

A test circuit or system is provided wherein data is stored in circuits or cells of an array or matrix with the use of conventional or normal operating voltages. Voltages at internal nodes of the circuits or cells are altered to magnitudes beyond the normal operating ranges, which includes significantly decreasing the offset voltage, for a short period of time and then the stored data is read out at normal voltages and currents and compared with the data written into the circuits or cells.

23 Claims, 2 Drawing Figures

DEFECT LEAKAGE SCREEN SYSTEM

TECHNICAL FIELD

This invention relates to integrated semiconductor circuits and systems and more particularly to a technique for testing circuits for field failure.

BACKGROUND ART

Various kinds of defects in semiconductor circuits, due to, e.g., pipes, ionic contamination and photolithography, that cause low level leakage are a major cause of circuit failures when these circuits are used in the field. Such defects have not been readily identifiable during normal testing of the circuits after manufacture.

Known testing methods for identifying some defects in semiconductor circuits and structures irradiate light of a given intensity or utilize heat to induce leakage in the circuits, as, e.g., described in commonly assigned U.S. Pat. No. 4,015,203, filed on Dec. 31, 1975, by R. L. Verkuil, and in U.S. Pat. No. 4,004,222, filed on Nov. 20, 1974, by R. E. Gebhard. Also, commonly assigned U.S. Pat. No. 3,795,859, filed on July 3, 1972, by J. F. Benante, N. M. Donofrio and R. H. Linton, discloses a testing technique wherein conventional or normal levels of operating voltages are used to test or determine the characteristics of the circuits or devices.

DISCLOSURE OF THE INVENTION

It is an object of this invention to test each circuit or cell of an array or matrix in a very short period of time for marginal defects that cause failures in the field.

In accordance with the teachings of this invention, a test circuit or system is provided wherein data is stored in circuits or cells of an array or matrix with the use of conventional or normal operating voltages. Voltages at internal nodes of the circuits or cells are altered to magnitudes beyond the normal operating ranges for a short period of time and then the stored data is read out at normal voltages and currents and compared with the data written into the circuits or cells. In a particular embodiment of the invention, a static bipolar memory cell has applied thereto normal standby voltages and currents to store a binary digit of information at the first and second complementary storage nodes of the cell and, thereafter, the current of the cell is reduced to a value below the normal standby operating range to alter the magnitudes of the voltages at the storage nodes so as to significantly decrease the offset voltage between the complementary storage nodes to increase the sensitivity of the cell and simultaneously to produce a stress at the more positive node. Simultaneously the voltage on the bit lines of the cell may also be lowered to a value outside the normal voltage operating range of the bit lines to further produce a stress on the more positive storage node. The data in the cell is then routinely read out to determine whether a change in state of the cell occurred due to the stress on the storage node.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
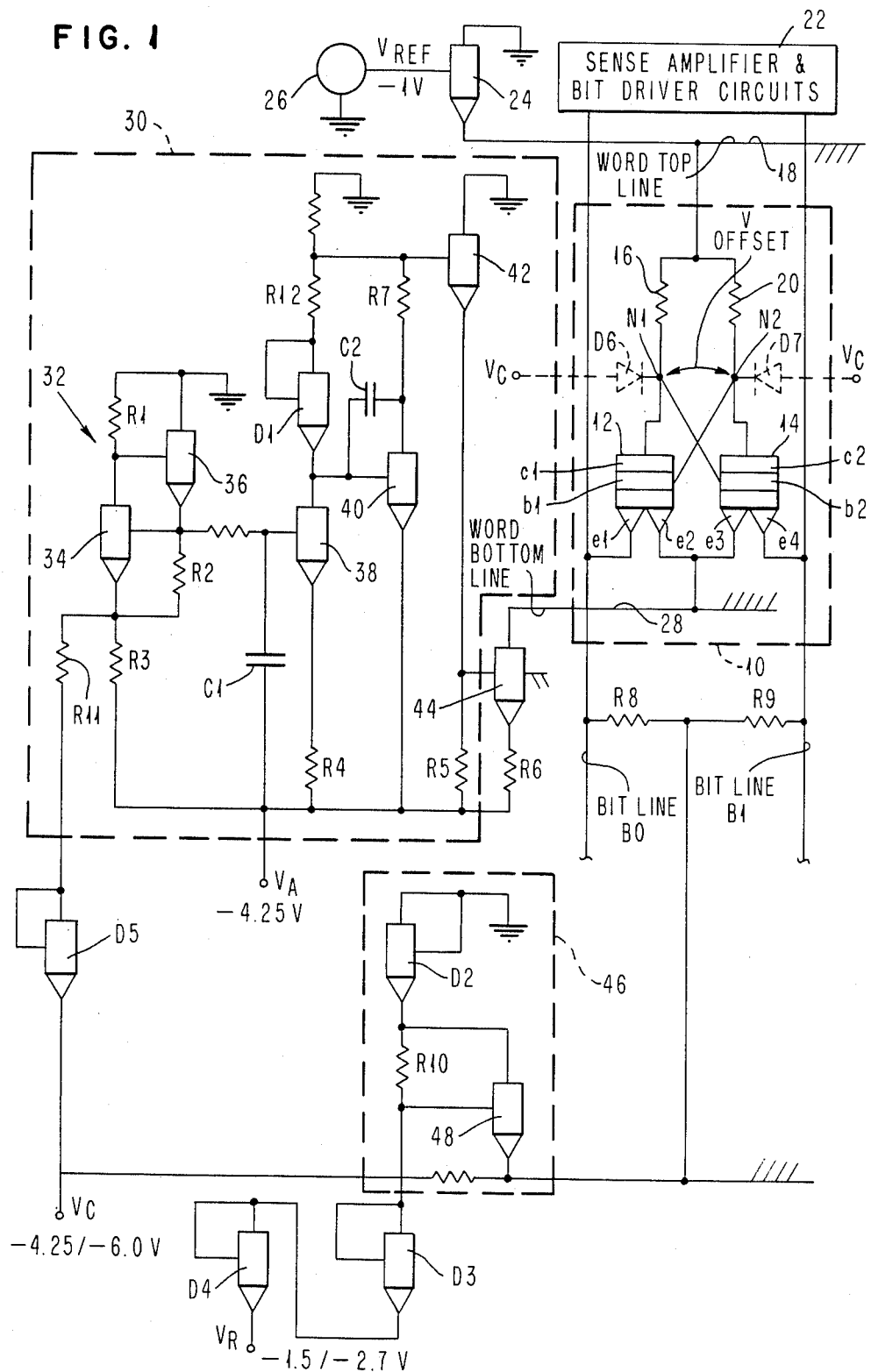
FIG. 1 illustrates a system of the present invention for screening out low level cell leakage defects on a semiconductor wafer or chip.

Referring to the drawings in more detail, there is illustrated in FIG. 1 an embodiment of the system of the present invention for testing a bipolar memory cell 10 for low level defects, particularly in P-N junctions coupled to storage nodes N1 and N2, which may be present in the semiconductor substrate in which the cell 10 is formed. The cell 10 is a cross-coupled latch which includes a first transistor 12 having a collector c1, a base b1 and first and second emitters e1 and e2 and a second transistor 14 having a collector c2, a base b2 and first and second emitters e3 and e4, with the collector c1 of the transistor 12 connected to the base b2 of the transistor 14 and the collector c2 of the transistor 14 connected to the base b1 of the transistor 12. A first load 16 is connected from a word top line 18 to the node N1 and a second load 20 is connected from the word top line 18 to the node N2. The loads 16 and 20 may conveniently be well known pinch resistors. The word top line 18 is connected to a point of reference potential, such as ground, through a transistor 24 which is controlled by a reference source 26 applying a reference voltage $V_{REF}$ of approximately $-1$ volt to the base of the transistor 24. A word bottom line 28 is connected to the second emitter e2 of the transistor 12 and to the first emitter e3 of the transistor 14. A pair of bit lines B0 and B1 are connected to the first emitter e1 of the transistor 12 and to the second emitter e4 of the transistor 14, respectively. Conventional sense amplifier and bit driver circuits 22 are connected to the bit lines B0 and B1 for writing and reading information into and from cell 10.

The system of the present invention includes a standby current reference circuit 30 which controls the standby current flowing in each memory cell, including cell 10. The standby circuit 30 includes a current reference circuit 32 having transistors 34 and 36 and resistors R1, R2 and R3 with resistor values chosen so as to provide a reference voltage at the base of transistor 34 of about $-3.15$ volts. The current reference circuit 32 is a simple feedback circuit with temperature sensitivity reduced by providing a ratio of resistance values of resistors R1 to R2 equal to 2. This reference voltage at the base of transistor 34, controlled by the voltage drop across resistor R3, is applied to the base of transistor 38 which has a stabilizing capacitor C1 connected to a voltage supply source $V_A$ of $-4.25$ volts. In the emitter leg of transistor 38 is a resistor R4 which preferably is made of a number of parallel pinch resistors of the type referred to hereinabove in connection with the load resistors 16 and 20 of the cell 10. The voltage drop across resistor R3 is applied across resistor R4 assuming the base-emitter voltage drops of transistors 34 and 38 are approximately equal. Current through resistor R4 flows through the collector of transistor 38 and diode D1 and causes a voltage drop across resistor R12. Since the base-emitter voltage drops of feedback transistor 40 and of diode D1 approximately match the base-emitter voltage drops of emitter follower 42 and standby current source transistor 44, the voltage drop across resistor R6 equals the voltage drop across resistor R12. Collector current of transistor 44, which is approximately equal to the current through resistor R6, supplies standby current to the cells resulting in an offset voltage that is substantially equal to the voltage across resistor R3 or resistor R4. Thus, the standby current reference circuit 30 provides a standby offset voltage of, e.g., approximately 400 millivolts for cell 10 that is relatively constant and independent of the absolute tolerance of the pinch resistors. Resistor R7 and capacitor C2 are provided to assure the stability of the circuit. This type of circuit is desirable in order to minimize disturbs due to the presence of alpha particles.

A bit line bias circuit 46 is coupled to bit lines B0 and B1 through resistors R8 and R9, respectively, for precharging bit lines B0 and B1 to a predetermined voltage level of about −1.4 volts. The bit line bias circuit 46 includes transistor 48 having its collector connected to a point of reference potential, such as ground, through a diode D2, with the emitter of transistor 48 connected to the common point between resistors R8 and R9. A pair of serially arranged diodes D3 and D4 are connected between a voltage supply source $V_R$ and the base of transistor 48 and to the diode D2 through a resistor R10.

Another voltage supply source $V_C$ is coupled to the emitter of the transistor 34 of the standby current reference circuit 30 through serially arranged diode D5 and resistor R11. The voltage supply source $V_C$ is connected to a region of the semiconductor chip which isolates the memory cells, such as cell 10, from each other. For example, if the semiconductor chip in which the cells are fabricated had a P type conductivity substrate on which an N type epitaxial layer was grown, the cells would be formed in N type epitaxial layer pockets surrounded by P type isolation regions to which the voltage supply source $V_C$ is connected. The P-N junction between the isolation region and the storage nodes N1 and N2 is indicated by diodes D6 and D7, respectively. The voltage supply source $V_A$ is not connected to the isolation regions.

In the normal operation of the cell 10, during standby, a voltage of about −1.7 volts is applied to the word top line 18. The voltage drop across the cell from the word top line 18 results in −2.3 volts on the word bottom line 28. A voltage of −1.4 volts is applied to each of the bit lines B0 and B1 by the bit line bias circuit 46. With the offset voltage between nodes N1 and N2 being approximately 400 millivolts, the normal current leakage at nodes N1 and N2 is in the pico-ampere range.

Figure 2:
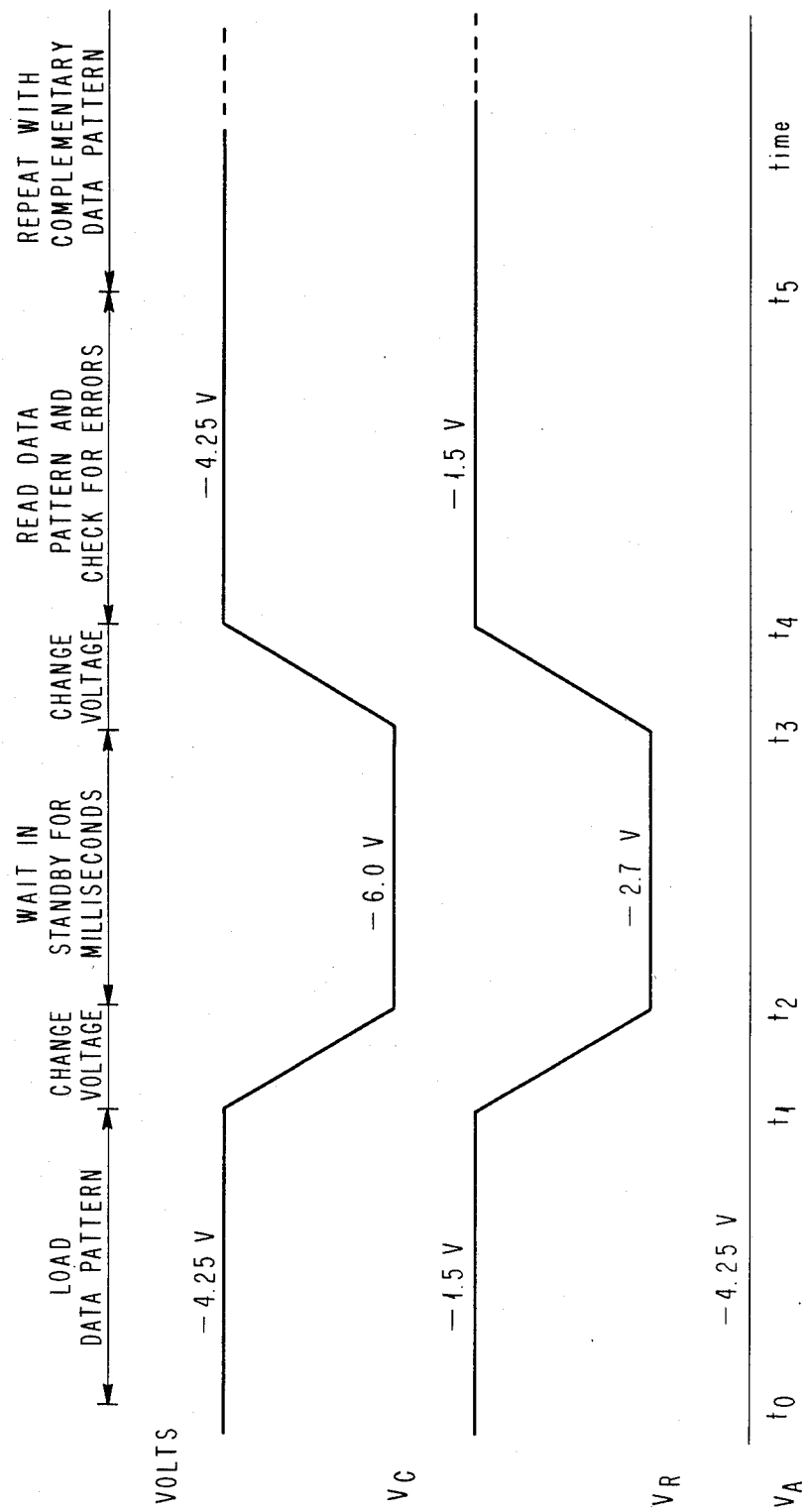
FIG. 2 is a pulse program for operating the system illustrated in FIG. 1.

To test the cell 10 for marginal defects, e.g. a small particle of foreign material lodged at a P-N junction, which are known to cause failures after an elapsed period of time during use in the field, reference may be had to the pulse program indicated in FIG. 2 of the drawing. Between times $t_0$ and $t_1$ a data signal or pattern, e.g., a 1 binary digit, is loaded into cell 10 from bit driver circuit 22 at normal memory operating voltages with the voltage supply sources $V_C$, $V_R$ and $V_A$ having voltages of −4.25, −1.5 and −4.25 volts, respectively. With the 1 digit stored in cell 10, transistor 12 will be turned on and transistor 14 will be off, with the offset voltage between nodes N1 and N2 at about 400 millivolts, this offset voltage being determined by the voltage drop across resistor R3 in the standby current reference circuit 30, as indicated hereinabove. It should be noted that during this normal operating period current does not flow through diode D5 and resistor R11 connected to the standby current reference circuit 30 from the voltage supply source $V_C$, nor through diodes D3, D4 and resistor R10 connected to the bit line bias circuit 46 from voltage supply source $V_R$.

After the 1 digit is stored in cell 10 at normal operating voltages, the leakage screen is accomplished by lowering the voltages at the voltage supply sources $V_C$ and $V_R$ from −4.25 to −6.0 volts and from −1.5 to −2.7 volts, respectively, while the voltage at voltage supply source $V_A$ remains at −4.25 volts, as indicated in FIG. 2 between times $t_1$ and $t_2$. These lower voltages are maintained for a few milliseconds, e.g., 10 milliseconds, between times $t_2$ and $t_3$. Between times $t_3$ and $t_4$ the voltages at the voltage supply sources $V_C$ and $V_R$ are returned to their original values of −4.25 and −1.5 volts, respectively. During the time period between $t_4$ and $t_5$, the data stored in cell 10 is read out through the sense amplifier 22 and compared with the data originally fed into cell 10. If the data read out during the time period $t_4$ to $t_5$ differs from the data originally written into cell 10, a defective cell 10 is indicated producing excessive leakage at node N2.

It should be noted that during the period between times $t_2$ and $t_3$ when the voltages at the voltage supply sources $V_C$ and $V_R$ are at −6.0 and −2.7 volts, respectively, current flows through diode D5 and resistor R11, which produces a lower voltage drop across resistor R3 and, thus, across resistors R4 and R6, lowering the standby current in cell 10 causing the voltage offset between nodes N1 and N2 to be reduced to, e.g., 130 millivolts. Since the voltage on the word top line 18 remains substantially unchanged during this period, the transistor 14 has a larger than normal voltage applied between its collector c2 and the isolation region or source $V_C$. This increased stress on the P-N junction between the N type epitaxial pocket or node N2 and the P type isolation region or substrate, or source $V_C$, indicated by diode D7, occurs at the same time as the cell offset is reduced, which enhances the detection of low level leakage defects.

It should be noted further that during the period between times $t_2$ and $t_3$ when the current is flowing through diodes D3 and D4 and resistor R10 the voltage on bit lines B0 and B1 decreases or is lowered from a normal operating voltage of about −1.4 volts to about −2.0 volts which produces a greater stress from node N2 to bit lines B1 and B0. Base-emitter leakage of transistor 12 and collector-emitter leakage of transistor 14 can thus be more readily detected. Additionally, node N2 may leak through a defective layer of insulation provided between a bit line or other conductive line and node N2. Leakage from node N2 to emitters e3 or e2 that are connected to the word bottom line 28 is also more likely to be detected due to the above mentioned reduction in offset voltage.

As indicated in FIG. 2 of the drawings, a similar cycle may be repeated beginning at time $t_5$ with complementary data, i.e., a 0 digit stored in cell 10, to test for leakage at node N1 through the transistor 12, the isolation pocket diode D6 or an adjacent layer of insulation.

It should be understood that for purposes of clarity a single memory cell has been illustrated in FIG. 1 of the drawing, however, in practice one hundred or more cells are arranged in parallel between the word top line 18 and the word bottom line 28, with each of these cells having a different pair of bit lines connected thereto. It should be further understood that many more word bottom lines may be connected to collectors of respective transistors similar to the collector of transistor 44, with an equal number of word top lines connected to emitters of respective transistors similar to the emitter of transistor 24, each transistor having its base connected to $V_{REF}$ of $-1$ volt. Likewise, each pair of bit lines may have a hundred or more cells connected thereto, with the selection of a particular cell being accomplished by addressing the appropriate word and bit lines, as is known.

Accordingly, it can be seen that each array of cells on a semiconductor chip or substrate can be readily screened by the system of this invention by simply adding a few elements to a standard circuit so as to provide a stress voltage at the nodes of each cell while decreasing the offset voltage in the cell, i.e., the cell leakage sensitivity is increased and simultaneously voltage conditions are modified which tend to increase the defect leakage. Only one such circuit is required on an entire chip.

Although the voltage at the voltage supply sources $V_C$ and $V_R$ may be decreased or lowered significantly, care should be exercised so as to not produce stresses in the cell which would cause a punch-through condition that would destroy the cell or chip.

As indicated in FIG. 1 of the drawings, separate pads on a chip are required for the voltage sources $V_C$ and $V_A$, however, after a chip has been tested, these two pads may be interconnected.

It is known that defects in memory cells of the type illustrated causing a leakage of greater than 1.0 microampere may be detected by routine testing, however, in accordance with the teachings of the present invention defects in these cells causing a leakage between 0.1 and 1.0 microampere may be readily detected inexpensively in each cell of a large array of cells within a very short period of time. These latter defects, which under normal testing are not detected, have been known to cause cell failures in the field after only a relatively short period of use. Thus, by identifying these defects at an early date, packaging and shipping costs can be saved and downtime of larger data systems can be minimized.

Although the testing of a static bipolar memory cell has been illustrated in connection with the test system of the present invention, it should be understood that other circuits, e.g., field effect transistor circuits, may also be tested in accordance with the teachings of this invention.

While the invention has been particularly shown and described with reference to preferred embodiments thereof, it will be understood by those skilled in the art that various changes in form and details may be made therein without departing from the spirit and scope of the invention.

What is claimed is:

1. A test circuit for a cross-coupled transistor cell having first and second storage nodes with a given offset voltage therebetween storing a given digit of binary data comprising
    means for decreasing said offset voltage during a given period of time,
    a point of reference potential,
    means for increasing a voltage difference between said reference potential point and one of said nodes during said given period of time simultaneously with said offset decrease, and
    means for reading data from said cell after said given period of time.

2. A test circuit as set forth in claim 1 wherein said means for decreasing said offset voltage includes means for decreasing a current flow through said cell.

3. A test circuit as set forth in claim 2 wherein said offset voltage decreasing means includes a standby current reference circuit.

4. A test circuit as set forth in claim 1 wherein said voltage difference increasing means includes an isolation region having a voltage varying terminal connected thereto.

5. A test circuit as set forth in claim 1 wherein said offset voltage decreasing means decreases said voltage during a first period of time and said data reading means reads data from said cell after said first period of time.

6. A test circuit as set forth in claim 1 further including a pair of bit lines, means for applying an operating voltage to said bit lines during a first period of time and means for applying a voltage to said bit lines during said given period of time having a magnitude significantly lower than that of said operating voltage.

7. A test circuit for a static memory cell having first and second storage nodes comprising
    a standby current reference circuit coupled to said cell, said circuit including means for passing current through said cell having a given magnitude during a first period of time and a significantly lower magnitude during a second period of time,
    a point of reference potential having a given voltage difference with respect to one of said storage nodes during said first given voltage differences during said second period of time when said current through said cell has said significantly lower magnitude,
    means for storing data in said cell during said first period of time, and
    means for reading data from said cell after said second period of time.

8. A test system for a static memory cell having first and second storage nodes comprising
    means for storing data in said cell during a first period of time,
    means for decreasing a current passing through said cell and simultaneosuly increasing a voltage difference between at least one of said storage nodes and a point of reference potential during a second period of time and
    means for reading data from said cell after said second period of time.

9. A test system as set forth in claim 8 wherein said current decreasing means significantly reduces an offset voltage between said storage nodes during said second period of time.

10. A test system as set forth in claim 9 further including first and second bit lines connected to said cell and wherein said voltage difference increasing means lowers the voltage on at least one of said bit lines.

11. A test system as set forth in claim 10 further including an isolation region surrounding said cell and wherein said voltage difference increasing means increases the voltage difference between said isolation region and at least one of said storage nodes.

12. A test system as set forth in claim 11 further including a diode disposed between said isolation region and each of said storage nodes.

13. A test system as set forth in claim 12 wherein said diode has a junction defined by P type conductivity semiconductor substrate and N type conductivity semiconductor substrate and said point of reference potential is disposed on said P type substrate.

14. A test system as set forth in claim 10 wherein said cell includes at least one P-N junction disposed between one of said bit lines and one of said storage nodes.

15. A test system as set forth in claim 8 wherein said current decreasing means includes a standby current reference circuit coupled to said cell.

16. A test system as set forth in claim 8 wherein said voltage difference increasing means includes a bit line bias circuit coupled to said cell.

17. A test system as set forth in claim 15 wherein said current decreasing means further includes means for altering a voltage at a voltage supply source of said standby current reference circuit.

18. A test system as set forth in claim 17 wherein said voltage altering means lowers the voltage at said voltage supply source of said standby current reference circuit.

19. A test system as set forth in claim 16 wherein said voltage difference increasing means further includes means for altering a voltage at a voltage supply source of said bit line bias circuit.

20. A test system as set forth in claim 19 wherein said voltage altering means lowers the voltage at said voltage supply source of said bit line bias circuit.

21. A test system as set forth in claim 18 further including a diode connected between said point of reference potential and said standby current reference circuit.

22. A test system as set forth in claim 21 wherein said standby current reference circuit includes a resistor and said diode is arranged in parallel to said resistor.

23. A test system as set forth in claim 20 wherein said bit line bias circuit includes a resistor and at least one diode connected between said resistor and the voltage supply source of said bit line bias circuit.

* * * * *